United States Patent [19]
Usuda et al.
[11] 3,713,045
[45] Jan. 23, 1973

[54] OSCILLATOR WITH A PIEZO-MECHANICAL VIBRATOR

[75] Inventors: Shogo Usuda, Yokohama; Kazuo Hamazato, Tokyo; Kiyoshi Uehara; Hisashi Uchida, both c/o Nippon Electric Company, Limited, Tokyo, all of Japan

[73] Assignees: Nippon Telegraph & Telephone Public Corporation; Nippon Electric Company Limited, Toky-to, Japan; part interest to each

[22] Filed: June 2, 1971

[21] Appl. No.: 149,289

[30] Foreign Application Priority Data

June 3, 1970 Japan ................................45/48256

[52] U.S. Cl. ..........331/109, 331/116 R, 331/116 M, 331/155, 331/156, 331/163, 331/183
[51] Int. Cl...........H03b 3/02, H03b 5/30, H03b 5/36
[58] Field of Search......331/109, 116 R, 116 M, 155, 331/156, 158, 159, 160, 163, 164, 185

[56] References Cited

UNITED STATES PATENTS 3,218,575 11/1965 Wittman .......................331/116 R X

FOREIGN PATENTS OR APPLICATIONS 19,242 8/1965 Japan...............................331/116 M
236,992 6/1959 Australia ..........................331/116 R

*Primary Examiner*—Roy Lake
*Assistant Examiner*—Siegfried H. Grimm
*Attorney*—Sughrue, Rothwell, Mion, Zinn & MacPeak

[57] ABSTRACT

Improved oscillator including an oscillator element, amplifier, amplitude limiter and tuned output circuit. A feedback path is provided between the tuned output circuit and the oscillator element. The amplitude limiter is connected between the amplifier and the tuned circuit to provide a constant amplitude signal to the tuned output circuit notwithstanding variations in the output from the amplifier caused by variation in the ambient temperature and aging. Further, by providing a resistance between the amplitude limiter circuit and the tuned circuit the resonance Q of the tuned circuit can be made high without producing an adverse effect on the amplitude limiter circuit.

6 Claims, 4 Drawing Figures

INVENTORS
SHOGO USUDA
KAZUO HAMAZATO
KIYOSHI UEHARA
HISASHI UCHIDA

BY Sughrue, Rothwell, Mion, Zinn & Macpeak
ATTORNEYS

OSCILLATOR WITH A PIEZO-MECHANICAL VIBRATOR

BACKGROUND OF THE INVENTION

The present invention relates to an oscillator using a piezomechanical vibrator. The oscillator of the invention provides for improved output level and frequency stability at the low-frequency band.

The "piezo-mechanical vibrator" is a general term which includes a piezo electric vibrator and a tuning fork vibrator. In oscillators which include piezo-mechanical vibrators it has been the practice to use the saturation property of a transistor for the purpose of defining the amplitude of oscillation. In such a case, particularly when the supplied source voltage varies, the D. C. working point of a transistor moves and varies the level of the exciting potential applied to the vibrator and therefore, the frequency of oscillation. Accordingly, the output level also varies causing significant waveform distortion. When the exciting level of the vibrator is minimized in order to minimize the frequency deviation due to aging, oscillation starting becomes blunt.

To compensate for these defects, an oscillator of the amplitude-limit type is generally used, wherein the exciting level of the vibrator is kept constant. However, in such an oscillator, the fluctuation due to loss-variation of the vibrator and also due to the variation in the degree of amplification of the amplifier circuit, caused by the ambient temperature changes and by aging, affects the output level of the oscillator.

SUMMARY OF THE INVENTION

An object of this invention is to provide an improved oscillator which has a stabilized output level and oscillation frequency notwithstanding variations in the ambient temperature.

BRIEF DESCRIPTION OF THE DRAWINGS

The present invention will hereinafter be explained in detail by referring to the attached drawings wherein.

DETAILED DESCRIPTION OF THE PREFERRED EMBODIMENT

Figure 1:
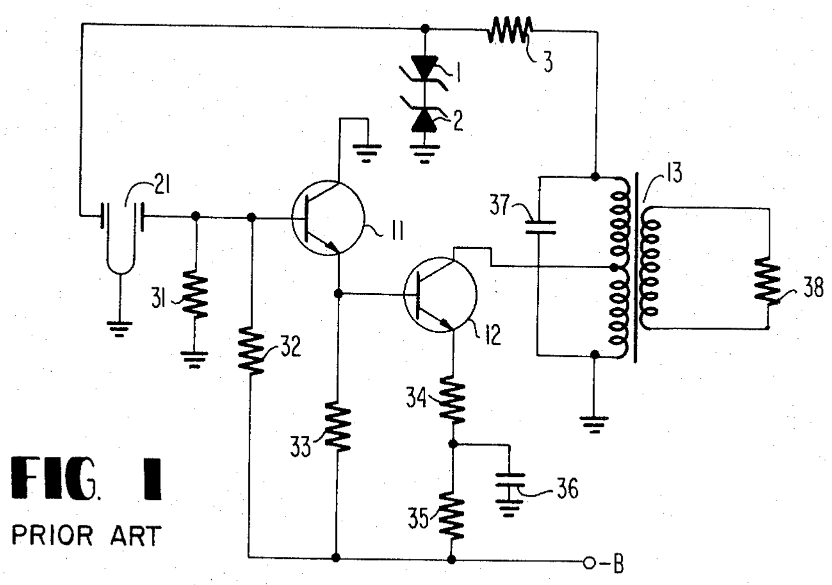
FIG. 1 PRIOR ART
FIG. 1 is a circuit diagram of a conventional oscillator utilizing the piezo-mechanical vibrator.

In the conventional oscillator using an amplitude-limiter, as shown in FIG. 1, a transistor 11 has a high input impedance in the grounded collector configuration. Its emitter is connected directly to a transistor 12 of the following stage. Resistors 31, 32, 33, 34 and 35 provide D.C. biases to respective transistors 11 and 12. An output tuning transformer 13 raises the oscillation-output voltage through the tapping-up thereof so as not to have any influence on the load-impedance of the transistor 12. A terminal of the transformer 13 is connected through the resistor 3 to zener diodes 1 and 2 and to the piezo tuning fork vibrator 21. In this case, the zener diodes 1 and 2, which are directly connected to each other with opposing polarities, are connected between the connecting point of said resistance 3 and said piezo-tuning fork vibrator 21 and the ground. The capacitor 36 functions as a by-pass connected to the connecting point of the resistances 34 and 35 of the transistor 12. The output voltage in the steady state condition is determined by the zener voltage of zener diodes 1 and 2. The transistors 11 and 12 operate completely on the linear section of their characteristic curves and hence their operation is independent of the D.C. supply source. Consequently, even if the supply source voltage varies, the oscillation amplitude generally remains constant while the output level and oscillation frequencies are always kept constant. However, in this oscillator, the fluctuation due to loss-variation of the vibrator and also due to the variation in the degree of amplification of the amplifier circuit, caused by the ambient temperature changes and by aging, affects the output level of the oscillator.

Figure 2:
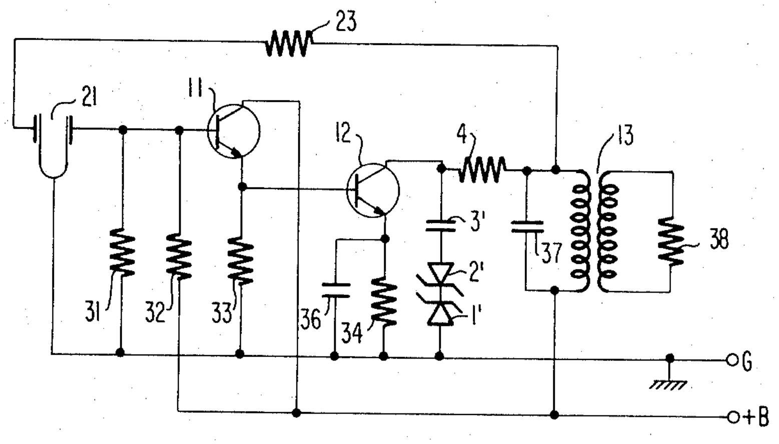
FIG. 2 is a circuit diagram of an oscillator of this invention also utilizing the piezo-mechanical vibrator.

The oscillator circuit of FIG. 2 is generally the same as the oscillator circuit described in FIG. 1. For simplicity of description, those constituents in FIG. 2 which are identical to those of FIG. 1 are given like reference numerals and their description will be omitted. The amplitude-limiter circuit is comprised of two zener diodes 1' and 2' directly connected with opposite polarities. This circuit is connected between the collector electrode of the transistor 12 and the ground. In this case, a capacitor 3' is provided for the D.C. blocking. A resistance 4 connected between the transistor 12 and the output tuning transformer 13 operates as a part of the load resistance of the transistor 12. There is feedback through the resistance 23 from the connecting point of the resistance 4 and the transformer 13 to the tuning fork vibrator 21. The resistance 23 is used for adjusting the exciting level of the vibrator.

The remarkable feature of this invention is that the resistance 4 is connected between the collector of the transistor 12 and the transformer 13 and the feedback signal is fed from the connection point of the resistor 4 and the transformer to the tuning-fork vibrator. Thus, the steady oscillation condition is determined by zener voltage of zener diodes 1' and 2', and transistors 11 and 12 operate completely on the linear sections of their characteristic curves thus operating in a manner uneffected by changes in the D. C. supply source. Further, when the resistance of resistor 4 is predetermined to be equal to the primary impedance (load impedance) of the output transformer, the resonance Q of the transformer 13 can be high without producing an adverse effect on the amplitude limiter circuit (constant-voltage circuit), thereby minimizing the distortion of the output waveform. Also, since there is feedback from the junction point of the resistor 4 and the transformer 13 to the tuning fork vibrator 21, the vibrator 21 can normally be excited in the vicinity of the resonance point in which there is little high harmonic component even if much complementary resonance exists in said tuning-fork vibrator 21. A most important advantageous effect of the present invention is that the fluctuation due to loss-variation of the tuning-fork vibrator and also due to the variation in the degree of amplification of the amplifier circuit, caused by the ambient temperature changes and by aging, does not affect the output level of the oscillator. The output can be determined by zener diodes 1' and 2' alone, so that the output level is very stable. Of course, it goes without saying that the output level is stable for fluctuations of the supply voltage. Accordingly, even in the case of low level excitation, the amplification degree at the time of oscillation starting can be set up high to provide for rapid starting thereof. Further, in the steady oscillation condition, the impedance of amplitude-limit circuit is rather low and the output transformer 13 is terminated by the resistance 4, and thus not only oscillation amplitude but also the frequencies of oscillation can be stabilized in spite of variation in load resistance 38.

Figure 4:
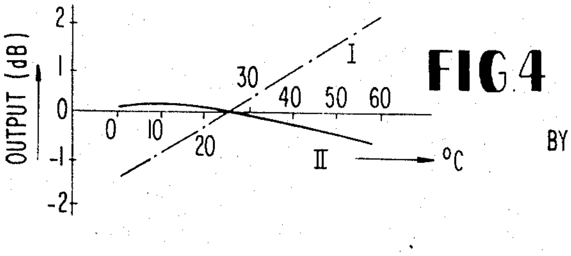
FIG. 4 shows characteristic curves for comparison between the oscillators shown in FIG. 1 and FIG. 2.

FIG. 4 shows changes in the output-level versus the ambient temperature change characteristics. These characteristics are obtained when the piezo-tuning-fork vibrator used has an oscillation frequency and resonance Q which are 700 Hz and 500 respectively. In this drawing, the curve denoted by I shows the characteristic in the conventional circuit of FIG. 1 and curve denoted by II shows the characteristic in the circuit according to the present invention. Also, the amount of distortion in the output waveform is 1 percent at the second-harmonic wave and 2 percent at the third-harmonic wave, when the resonance Qc in the output tuning transformer is 12.

Figure 3:
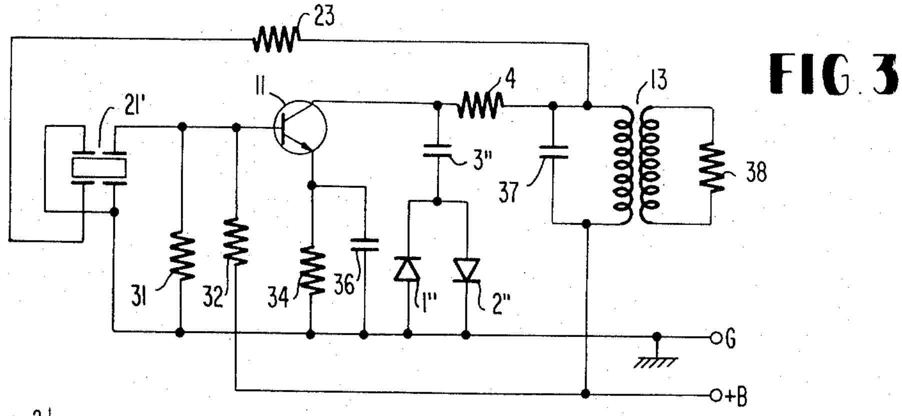
FIG. 3 is a circuit diagram of another embodiment of this invention.

FIG. 3 shows another embodiment of the present invention which is applied to a low frequency crystal oscillator. The crystal unit 21' constitutes an oscillator circuit with a single transistor 11, and functions as a phase inverter with the four-terminal connection. The amplitude-limiter circuit has two conventional diodes 1'' and 2'' such as the IS–952 or SD–14 type diode manufactured and sold by Nippon Electric Company Ltd., each being connected in parallel with opposite polarities. The principle of operation is the same as that of the oscillator of FIG. 2, and so an explanation thereof is omitted.

According to the present invention, there is provided an oscillator having a very simple circuit arrangement while providing stable output levels and frequencies at the low frequency band. Further, there is little output wave distortion and a good starting characteristic.

What is claimed is:

1. An oscillator with a piezo-mechanical vibrator, comprising: an oscillation amplification circuit having an input coupled to said piezo-mechanical vibrator and an amplitude-limiter circuit at the output side thereof; a series circuit of a tuning transformer and a resistor which operates as a load of said oscillation amplification circuit; and a feedback circuit which feeds a feedback signal from the connection point of said resistance and said tuning transformer to said piezo-mechanical vibrator.

2. An oscillator circuit comprising:

a. a piezo-mechanical vibrator, b. amplifying means coupled to said piezo-mechanical vibrator for amplifying the oscillations produced thereby, c. an amplitude limiter means connected to the output of said amplifying means for limiting the amplitude of the oscillations, d. a tuned circuit, e. means, including a first resistance means of a value equal to the input impedance of said tuned circuit, for connecting said amplifying means to said tuned circuit, said first resistance means being connected between said amplitude limiter means and said tuned circuit, and f. feedback means, including a second resistance means, connected between said tuned circuit and said piezo-mechanical vibrator.

3. The oscillator circuit of claim 2 wherein said second resistance is adjustable to vary the exciting potential supplied to said vibrator.

4. The oscillator circuit of claim 3 wherein said amplitude limiter circuit comprises first and second serially connected zener diodes with capacitor means serially connected to the zener diode pair.

5. The oscillator circuit of claim 4 wherein said piezo-mechanical vibrator is a piezo-electric crystal.

6. The oscillator circuit of claim 4 wherein said piezo-mechanical vibrator is a tuning-fork-vibrator.

* * * * *